United States Patent [19]
Avram et al.

[11] Patent Number: 6,025,714
[45] Date of Patent: Feb. 15, 2000

[54] MAGNETIC RESONANCE IMAGING (MRI) USING FAST SPIN ECHO (FSE) IMAGING PROCESS

[75] Inventors: Hector E. Avram, Foster City; Robert Wagner, El Cerrito; Leon Kaufman; Andrew Li, both of San Francisco, all of Calif.

[73] Assignee: Toshiba America MRI, Inc., Tustin, Calif.

[21] Appl. No.: 08/847,813

[22] Filed: Apr. 25, 1997

[51] Int. Cl.[7] .................................................... G01V 3/00
[52] U.S. Cl. ........................ 324/309; 324/306; 324/307; 600/410
[58] Field of Search ..................... 324/309, 307, 324/312, 313, 314, 322, 396; 600/410

[56] References Cited

U.S. PATENT DOCUMENTS

| | | |
|---|---|---|
| 4,721,912 | 1/1988 | Kaufman et al. . |
| 4,728,893 | 3/1988 | Feinberg ................................. 324/309 |
| 4,857,846 | 8/1989 | Carlson .................................. 324/309 |
| 4,949,041 | 8/1990 | Herzlia .................................. 324/309 |
| 5,270,654 | 12/1993 | Feinberg ................................ 324/309 |
| 5,329,231 | 7/1994 | Hatta et al. . |
| 5,557,204 | 9/1996 | Lenz ...................................... 324/309 |

FOREIGN PATENT DOCUMENTS

| | | |
|---|---|---|
| 0 318 212 A2 | 11/1988 | European Pat. Off. . |
| 0 515 197 A1 | 5/1992 | European Pat. Off. . |
| 0 599 456 A1 | 9/1993 | European Pat. Off. . |

OTHER PUBLICATIONS

Lenz, G.W., "Dual Contrast Turbose Sequence Optimized For Low Field Strength," Medical Engineering Group, Siemens AG, Erlangen, Germany, SMRM, 1994, p. 779.

Low, et al., "Fast Spin–Echo MR Imaging Of The Abdomen: Contrast Optimization and Artifact Reduction," SMR, 1994, vol. 4, No. 5, JMRI, pp. 637–645.

Avram et al., "Conjugation and Hybrid MR Imaging," Radiology 1993; 189:891–895.

Vinitski, et al., "Conventional and Fast Spin–Echo MR Imaging: Minimizing Echo Time," JMRI 1993; 3:501–511.

*Primary Examiner*—Christine Oda
*Assistant Examiner*—Brij B. Shrivastav
*Attorney, Agent, or Firm*—Nixon & Vanderhye P.C.

[57] ABSTRACT

A magnetic resonance imaging sequence synergistically combines Half Fourier Transform complex conjugation with shared echo imaging. The Half Fourier Transform complex conjugation reduces data acquisition time and permits the data acquisition per scan to be accomplished with a single RF transmission loop. The shared echo imaging provides multiple images of an image plane from a single scan, yet with different contrast and a larger number of slices. In an alternative embodiment, phase correction is provided between the non-shared echo responses.

17 Claims, 14 Drawing Sheets

MAGNETIC RESONANCE IMAGING (MRI) USING FAST SPIN ECHO (FSE) IMAGING PROCESS

FIELD OF THE INVENTION

This invention relates to magnetic resonance imaging. More particularly, this invention relates to shared echo imaging sequences.

BACKGROUND OF THE INVENTION

Magnetic resonance imaging (MRI) is by now a well known and well documented phenomena. It is known that nuclei in a body naturally assume random orientations with respect to each other. Using MRI techniques, certain of these nuclei can be manipulated to cause measurable magnetic responses from within the body being imaged.

In MRI, the object to be imaged is placed into a generally homogeneous magnetic field $H_o$ (FIG. 1) created by an external static magnet source, shown in FIG. 5. The $H_o$ field causes the above-described nuclei (or some percentage of them) in the object to align themselves in the direction of $H_o$. Because of their magnetic moment, these nuclei spin at a particular frequency called the Larmor frequency. In FIG. 1, the nucleus is modeled as an arrow (indicating its magnetic moment) spinning in alignment with the z-direction If no other perturbation is introduced to the system, the nuclei continue to spin in alignment with each other due to the presence of the $H_o$ magnetic field. But, in MRI, the nucleus is perturbed by an RF pulse created by RF transmission coils (FIG. 5). This RF transmission causes the nucleus to tip (or nutate) at a certain angle, usually 90°, relative to the direction of the homogeneous magnetic field. Because the nucleus is originally spinning in the direction of the homogeneous magnetic field before application of the nutating RF pulse, the RF pulse causes it to nutate to a plane orthogonal to the direction of the magnetic field (the x-y plane) where it will precess, as shown in FIG. 2.

Once the RF pulse is removed, the precessing nucleus gradually relaxes back into alignment with the homogeneous magnetic field $H_o$, as shown in FIG. 3. Since each nucleus can be conceptualized as a small magnet, the vector component of magnetism from the nuclei in the direction of the homogeneous magnetic field is zero when the nucleus is fully nutated 90° (FIG. 2). As the nucleus relaxes back into alignment with the homogeneous magnetic field (FIG. 3), the magnetization vector component in the direction of the homogeneous magnetic field gradually increases to a maximum when the nucleus returns to the fully aligned position, with a time constant $T_1$. The component of the magnetic vector in the x-y plane decreases with a time constant $T_2$. As the nucleus relaxes from the 90° position to the aligned position, it transmits an RF signal at the Larmor frequency as a result of these changing magnetic vector components.

The RF signal emitted by the relaxing nuclei can be received by an RF receiver coil, processed by control and image processing circuitry, and displayed as a processed image signal on a video display tube, as shown in FIG. 5.

Of course, a body to be imaged contains many such nuclei. To obtain MR image signals, one usually isolates smaller volumes or areas of the body for selective analysis. In two-dimensional Fourier Transform MRI, nuclei in the body are spatially encoded using gradient magnetic fields in the three orthogonal directions of the image volume. Traditionally, the x, y, and z axes defining the gradient magnetic field directions are referred to as the read, phase and slice directions, respectively. The slice gradient ($G_z$) imposes a gradient magnetic field along the length of the body being imaged in order to select a slice of the body for data acquisition. When data acquisition is completed for one slice, another slice will be selected until the full volume desired to be imaged has been slice selected and imaged.

Once a slice is selected, the area of the slice can be viewed as a two-dimensional image defined by the so-called phase-direction (y) and the read-direction (x), as shown in FIG. 4. In the phase direction, another magnetic gradient coil (this one having a variable amplitude ($G_y$)) is used to spatially encode the nuclei along the y-axis by the phase of the spins. As shown in FIG. 4, the spins of the nuclei along the y-axis have identical frequencies, but differ in phase, or amount of rotation, relative to one another. This is accomplished by temporarily altering the frequency of the spins in the y direction after the 90° RF pulse nutates them. If the frequencies of spin are temporarily altered unevenly in one spatial direction by a variable amplitude magnetic gradient field, then when the gradient field is removed, the nuclei will return to the same Larmor frequency but with different spatial phase encoding. By then viewing the signal strength of nuclei at a particular phase, one can determine the density of nuclei at the spatial location corresponding to that particular phase.

A similar spatial encoding occurs by the so-called read direction magnetic gradient field ($G_x$). This gradient field changes the frequency of rotation of the nuclei across a line in the x-axis direction just as the NMR image signal is read out by the RF receiving coil. The result, as shown in FIG. 4 for example, is a spatial difference in frequency (speed) of the spins in the x-direction just as the NMR signal is read. Thus in FIG. 4, the nuclei in the left-most portion of the x-axis are shown spinning slowly, while the nuclei in the right-most portion of the x-axis are shown spinning more rapidly. By taking the NMR signal with the frequency encoding, the resultant RF signal, when Fourier transformed, will yield a curve of amplitude versus frequency. And since the amplitude corresponds to nuclear density and the frequency corresponds to particular locations in the x-direction, the curve also represents nuclear density versus x-direction location, i.e., an image of nuclei in x-direction space.

As is known in the art, the spatial phase encoding in the y-direction corresponds to lines of resolution in the final image. That is, a greater number of phase encodings along the y-direction can produce a greater number of lines of resolution in the final image. Typically, MRI systems have 64, 128, or 256 lines of resolution, and thus a corresponding number of phase encodings along the y-axis. For each encoding that is to result in a line of resolution, separate NMR signal data must be collected. As is also known in the art, one method of collecting NMR data is to flip the spinning nuclei 180° to cause an echo (spin echo) of the NMR signal. After a single 90° nutation pulse, several NMR signals can be collected by imposing several consecutive 180° pulses to cause several consecutive spin echoes. By changing the phase encoding between each consecutive 180° pulse, one can obtain data for several lines of resolution using only a single 90° nutation pulse. This process of using multiple flips following the original nutation pulse in order to obtain multiple spin echoes is referred to as fast spin echo sequencing.

Unfortunately, the number of 180° nutation pulses that result in useful data is limited by $T_2$. As described above with respect to FIG. 3, following the 90° nutation pulse, the nuclei begin to relax back into alignment with the $H_o$ field.

While relaxing ($T_2$), the nuclei can be flipped several times (changing the phase encoding each time) in order to obtain several spin echo signals. But, once the nuclei relax for several $T_2$'s, the signal to noise ratio of the resultant NMR signal is too small for the signal to be discriminated and the process must be started again with a new 90° nutation pulse. The present invention is not limited to any particular number of spin echoes obtained from each 90° nutation pulse, but for purposes of illustration only, seven echoes are used in some of the following examples.

FIG. 6 illustrates a typical NMR 2DFT (two-dimensional Fourier Transform) sequence. FIG. 6 illustrates the general timing of the RF transmission pulses (RF) from the RF transmitter coil shown in FIG. 5. It also shows the timing of the gradient coil pulses ($G_x, G_y, G_z$) in the read, phase, and slice directions, respectively. Finally, FIG. 6 illustrates the resultant NMR signal received by the RF receiver coil shown in FIG. 5.

The RF transmission signal begins with a 90° nutation pulse occurring at the same time the slice gradient ($G_z$) is selecting the slice of nuclei to be imaged. As a result, the nuclei in the slice are nutated 90° (into the position shown in FIG. 2), leaving the nuclei in neighboring slices in alignment with the $H_o$ field. The nuclei in the selected slice immediately begin relaxing back into alignment with the $H_o$ field, as described with respect to FIG. 3. Thereafter, the first 180° RF pulse is applied followed by phase encoding pulse imposed by the phase encoding gradient field $G_y$ at the first line of resolution (k=+1). As a result of the above steps, a slice of nuclei has been selected and within that slice a line of resolution has been selected. After an identifiable time lapse, the first spin echo (NMR) will occur, during which, the read gradient $G_x$ is imposed for frequency encoding.

After the signal reading, the selected nuclei are re-phased by an equal or opposite phase gradient (in this case k=-1) following the readout pulse and before the next 180° RF pulse.

The NMR signal is stored in the image processing circuitry (FIG. 5) until a full collection of NMR data is obtained for a full slice. Once the data for the slice is obtained, each NMR signal in the slice is plotted into a two-dimensional array of data points, which when Fourier transformed in two dimensions will yield an image of the nuclei density at each pixel location of the slice plane.

The remaining NMR signals in the slice are obtained as shown in FIG. 6. After the first NMR signal is received and the nuclei are re-phased, a new phase encoding is imposed. In the example of FIG. 6, seven NMR signals are obtained from each 90° nutation pulse. To cover 256 lines of resolution, approximately 36 scans (90° pulses) must be employed (36 scans×7 NMR signals per scan=252 lines of resolution). When the k-space does not get filled by a whole number of scans, an additional scan can be used (i.e., a 37th scan) or the zero fill signal can be used to fill in the missing scan lines.

In the example of FIG. 6, just after the second 180° nutation pulse (following the first 90° nutation pulse), the phase gradient $G_y$ phase encodes at the position k=+19. The read gradient $G_x$ is then applied, and the second spin echo (NMR) is obtained. Afterward, re-phasing occurs by $G_y$ imposing an equal and opposite signal at K=-19.

After the third 180° pulse, the phase gradient selects the k=+37 position and the third NMR spin echo is obtained. Thereafter de-phasing occurs at k=-37. This continues for seven spin echoes, each having an associated phase encoding.

In FIG. 6, the seven echoes are obtained after k=+1, +19, +37, +55, +73, +91 and +109 phase encoding signals, respectively. When the seventh spin echo has been obtained, the signal strength of the NMR signal has decayed due to the relaxing of the nuclei back into alignment with the static magnetic field, $H_o$. Accordingly, after the seventh NMR spin echo is obtained, the nuclei are permitted to relax for a predetermined period of time and then the next 90° nutation pulse is applied for the same slice selection.

After the second 90° nutation pulse, collection of NMR data continues for the slice selection. For example, in FIG. 6, phase encoding picks up at the k=+2, k=+20, k=+38, k=+56, k=+74, k=+92, and k=+110 positions. Again, after each echo signal is obtained an equal and opposite phase correction signal (k=-2, -20, -38, -56, -74, -92, and -110, respectively), is applied to zero sum the phase angle. In this example, the second scan increments each k-space phase encoding signal by one over the k-space phase encoding of the first scan. The incrementation over the 36 scans will change after the eighteenth scan (following phase encoding of k=+18, +36, +54, +72, +90, +108 and +126), in order to avoid overlap of the k-space. Thus, the nineteenth scan may decrement from the k-space of the first scan in order to cover the negative k-space. In other words, the nineteenth scan NMR signals may be obtained following phase encoding of k=-0, -18, -36, -54, -72, -90, and -108 (with equal and opposite phase correction signals of k=+0, +18, +36, +54, +72, +90, and +108 following the respective NMR signals). Of course, +1 or -1 incrementation is not required; other k-space scan sequences are equally plausible, provided the cumulative scans cover the full k-space (k=-128 to k=128, in FIG. 6) for each slice.

After the seven NMR readings following the phase encodings of the second scan, the NMR signal has again decayed below an acceptable level and a new 90° nutation pulse is applied. Although not shown in FIG. 6, one can appreciate that this process will continue for slightly more than 36 scans to obtain 256 scan lines of data, by incrementing the phase encoding k-space for each scan line. A 37th scan line can be used to obtain the few additional scan lines of data needed to complete the 256 lines of resolution in this example or the additional scan lines can be obtained from the zero k-space data, as described above.

FIG. 7 shows a short-hand way of illustrating the scanning sequence shown in FIG. 6. The seven 180° nutation pulses per 90° nutation pulse yield seven spin echoes, which are identified in FIG. 7 (like FIG. 6) by a circled number. The 256 lines of resolution in k-space phase encoding are on the horizontal axis, from k=-128 on the left to k=+127 on the right TE refers to the periodicity of the 180° nutations following the 90° nutation (echo spacing). That is, the seven 180° nutation pulses occur, as shown in FIG. 6 at a particular period, which corresponds to 1TE through 7TE in FIG. 7.

As shown in FIG. 7 (and described above with respect to FIG. 6), the sequence of phase encoding is such that, from the 36 scans, the NMR signals following the set of first 180° pulses (immediately following the thirty-six 90° pulses) will correspond to approximately the k=-17 through k=+18 phase encoding positions. The NMR signals from the set of second 180° pulses following the thirty six 90° pulses will fill approximately the k=-35 through k=-18 and k=+19 through k=+36 positions. Similarly, the NMR signals from the set of third 180° pulses following the thirty six 90° pulses will fill approximately the k=-53 through k=-36 and k=+37 through k=+54 positions, and so on for all seven sets of 180° pulses for all thirty six scans.

FIG. 7 also illustrates how the seven echoes following the thirty six scans will not completely fill the k-space. The NMR signals from the seventh set of 180° pulses following the thirty six 90° pulses will fill the far edges of the k-space only to positions k=−125 and k=+126. Of course, in the FIG. 6 embodiment, the full k-space extends to k=−128 and k=+127. The negative and positive k-space edges thus are left with, respectively, three and one unfilled resolution lines. These can be filled by either taking another scan, or the zero fill signal can be used to fill the missing scan lines.

In FIG. 7, the first echoes (the set immediately following the 90° pulse) will be taken earliest in the T2 decay period and thus will dominate apparent contrast. In FIG. 7, these first echoes occupy the k=−17 through k=+18 position, i.e., the center of k-space, and correspond to low spatial frequency data. Similarly, in FIGS. 5, 6 and 7, the latest echoes (the seventh echoes) have the weakest signal strength due to T2 decay and thus contribute to the high spatial frequency data. As a result, the signal in FIG. 7 behaves as if a low pass (spatial frequency) filter had been applied.

The signals need not be obtained in the fashion of FIGS. 6 and 7. FIG. 8 illustrates the data acquisition sequence in which the last echoes contribute to the center of k-space and the first echoes contribute to the ends of k-space. The result is a signal that behaves as if a high pass (spatial frequency) filter had been applied.

FIGS. 9 and 10 illustrate still further alternatives in which a balanced acquisition of early and late echoes (i.e., high and low signal strength signals) contribute to high encoding. In FIG. 9, the high signal encoding is in the negative half of k-space and in FIG. 10, the high signal encoding is in the positive half of k-space.

It has been previously discovered that the acquisition time needed to obtain data for a full k-space can be reduced by slightly less than one-half if one employs Half Fourier imaging. The Half Fourier concept is described in Avram, et al, *Conjugation and Hybrid MR Imaging*, Radiology 189:891 (1993) and in Feinberg, U.S. Pat. No. 4,728,893, Increased Signal-to-Noise in MRI Using Synthesized Conjugate Symmetric Data (1988), both of which are incorporated by reference into the present disclosure.

An illustration of how Half Fourier imaging works is shown in FIGS. 11 and 12. In FIG. 11, for example, the full k-space data is acquired using only four echoes from each 90° nutation pulse. The four echoes are shown as circled numbers and contribute to phase encoding in the negative half of k-space. The zero k-space location and the half of signal number 4 lying in the positive k-space location are also obtained during the scans.

In FIG. 11, the highly encoded high signals contribute to the (negative) k-space positions and the late echo number 4 contribute to the central k-space positions. Because of the complex symmetry that exists between Fourier transform pairs in the negative and positive k-space, the missing data in the positive k-space can be obtained by conjugate symmetry from the three signals lying fully in the negative k-space. This means that one needs to gather only roughly one-half of the data used to construct the NMR image. This can save approximately one-half of the data acquisition time as shown in FIG. 11 where only four TE periods are needed to complete the NMR image compared to seven such periods in FIG. 8. Alternatively the extra available acquisition time can be used to produce more slices, or to generate more echoes to improve image resolution.

In FIG. 11, the missing data, which is obtained by conjugate symmetry, is shown as dashed lines in the positive k-space while the actually acquired data is shown as complete lines with circled numbers. FIG. 11 corresponds to FIG. 8 since it acts as a high pass filter, but improves on FIG. 8 since it decreases the data acquisition time.

FIG. 12 is identical to FIG. 11 except that it behaves as a low pass filter, as did the sequence depicted in FIG. 7. Again, the sequence in FIG. 12 reduces acquisition time through complex conjugation, as compared to the sequence of FIG. 7.

What is common to all of the Fast Spin Echo techniques discussed above with respect to FIGS. 6–12 is that different components of k-space are encoded by data modulated by different amounts of T2. In other words, the T2 response is different for high and low spatial frequency features in the image. The T2 effect is inherent to Fast Spin Echo techniques and thus the spatial encoding in k-space must be considered inherent as well, even though corrections can be made (for example, Chen, U.S. Pat. No. 5,517,122, T2 Restoration and Noise Suppression of Hybrid MR Images using Wiener and Linear Prediction Techniques, (1996)).

SUMMARY OF THE INVENTION

The present inventors have discovered another sequence for obtaining Fast Spin Echo data which requires minimal data acquisitions, yet yields two usable images per imaging scan. The two images obtained are at different contrast and thus will reveal different information to the experienced reader. The present invention synergistically combines two different NMR Fast Spin Echo sequencing methods: the use of shared echoes to obtain multiple images with Half Fourier Transform sequences to reduce acquisition time.

Others have used shared echo techniques to obtain multiple images, such as Lenz, Dual Contrast TurboSE Sequence Optimized for Low Field Strength, (1994), but the use of shared echo techniques as a compliment to complex conjugation has not previously been realized. Lenz, for example, teaches away from such an approach in describing how a proton density weighted image and a T2 weighted image can be obtained by a shared echo technique. Lenz teaches that even with a shared echo technique, not all k-space segments for the proton density weighted image can be obtained before the central k-space segment for the T2 weighted image must be sampled to keep the effective TE period in a moderate range. For this reason, it appears that Lenz requires two separate RF transmission coil loops, although the exact reason for and operation of the two loops is not obvious from the Lenz disclosure.

With the present invention, the combination of shared echo imaging and Half Fourier Transformation provides immediate time saving advantages with a single RF transmission coil loop to acquire all of the image data. This combination also has the synergistic effect of a more symmetric point spread function, which translates into higher resolution images.

BRIEF DESCRIPTION OF THE DRAWINGS

The purpose and advantages gained by the present invention will be understood by careful study of the following detailed description of the presently preferred embodiment with particular reference to the accompanying drawings, in which.

DETAILED DESCRIPTION OF THE PRESENTLY PREFERRED EMBODIMENT

Figure 3:
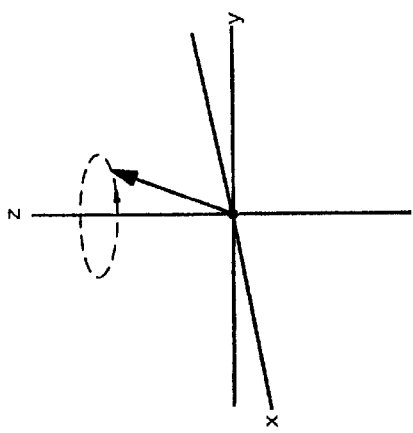
FIG. 3 is an orthogonal depiction of the nucleus of FIG. 2 precessing around the z-axis.
Figure 2:
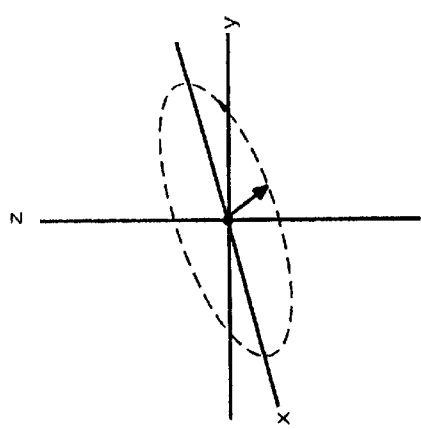
FIG. 2 is an orthogonal depiction of the nucleus of FIG. 1 nutated 90°.
Figure 1:
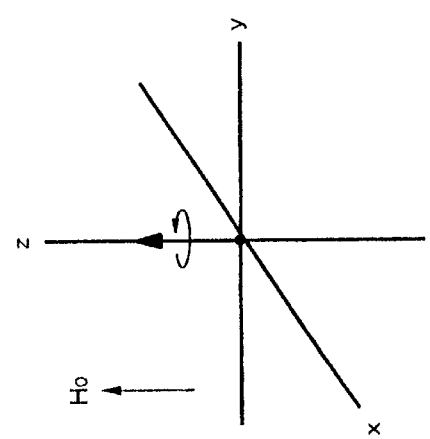
FIG. 1 is an orthogonal depiction of a nucleus aligned with a static magnetic field.
Figure 4:
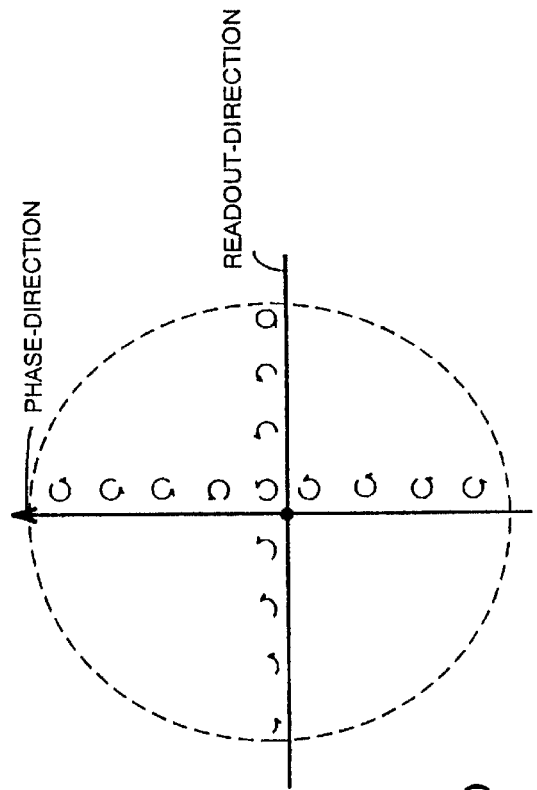
FIG. 4 is a graphical view of the frequency and phase encoding within a image slice.
Figure 5:
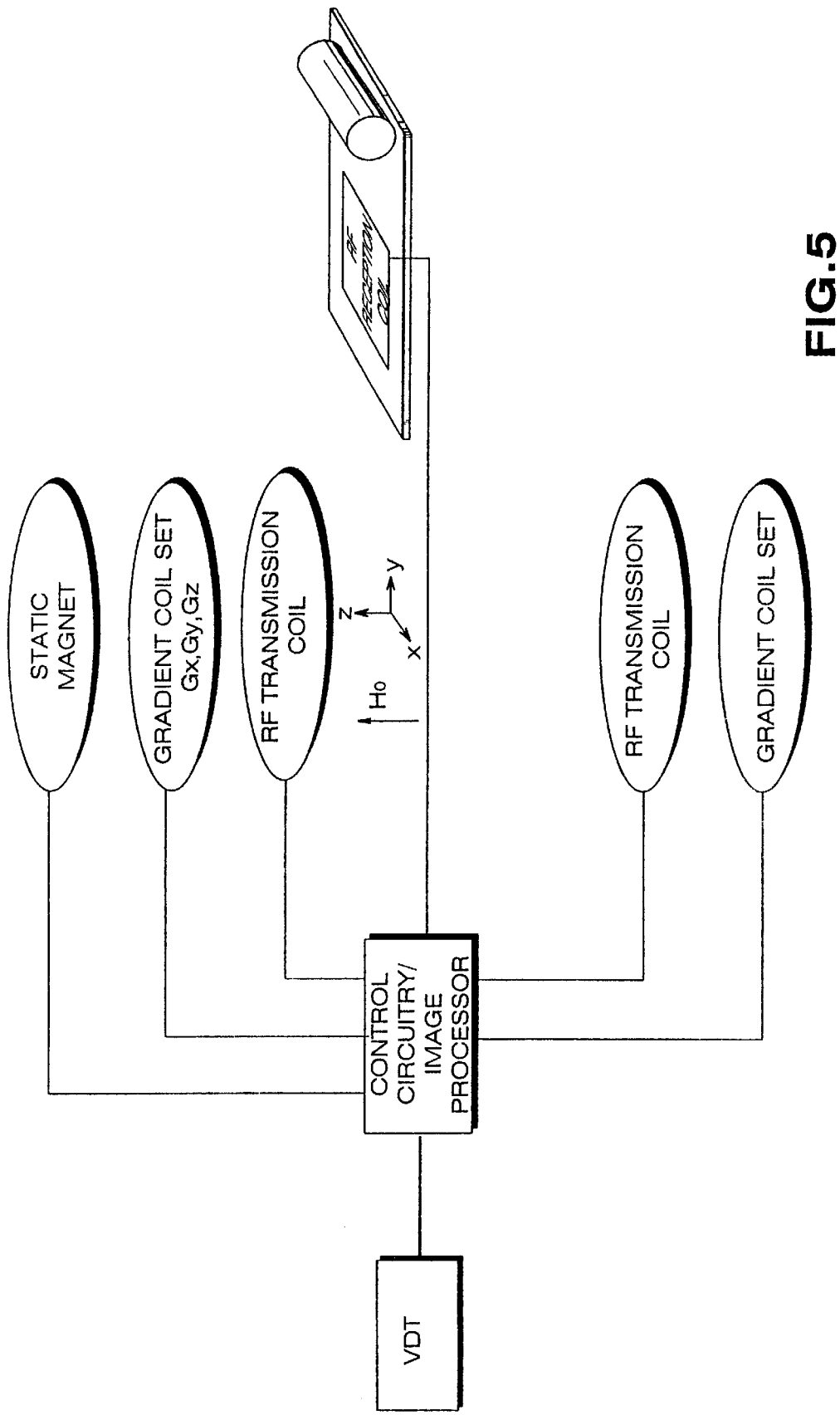
FIG. 5 is a schematic diagram of an MRI system.
Figure 6:
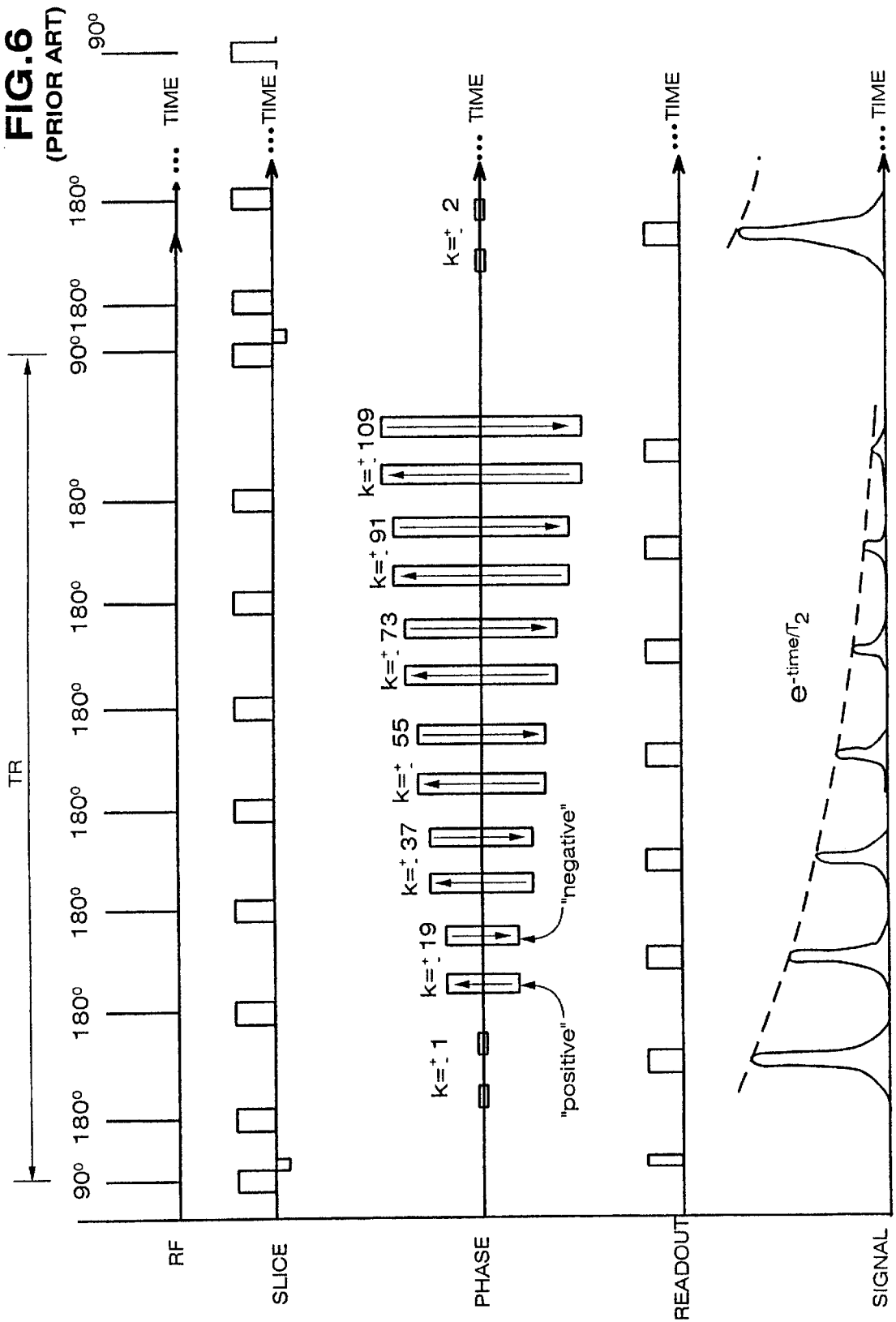
FIG. 6 is a conventional Fast Spin Echo MRI sequence.
Figure 7:
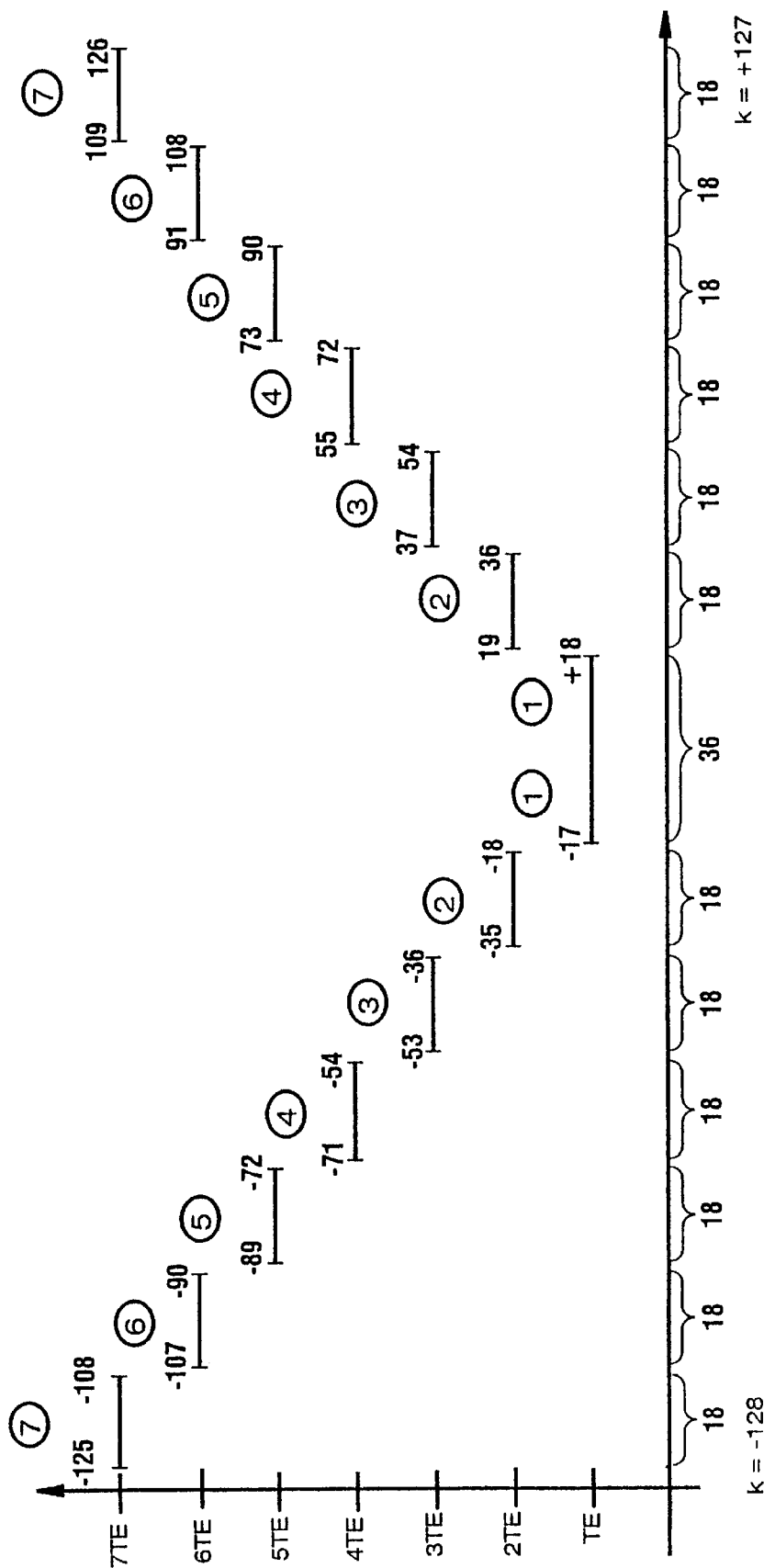
FIG. 7 is a graphical representation of the MRI sequence of FIG. 6.
Figure 10:
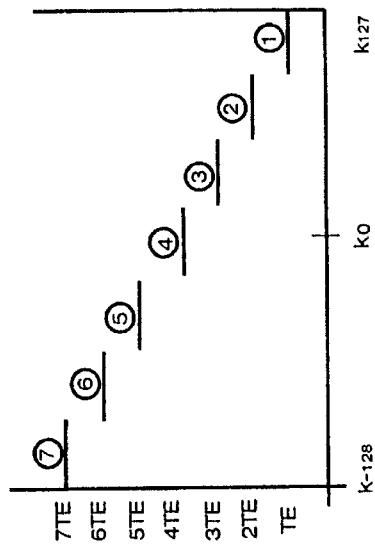
FIGS. 8, 9 and 10 are alternative conventional Fast Spin Echo MRI sequences.
Figure 9:
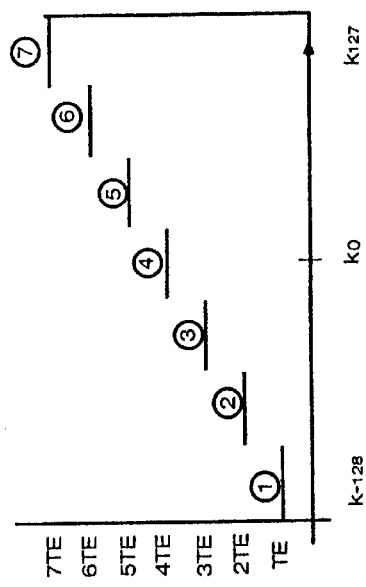
Figure 8:
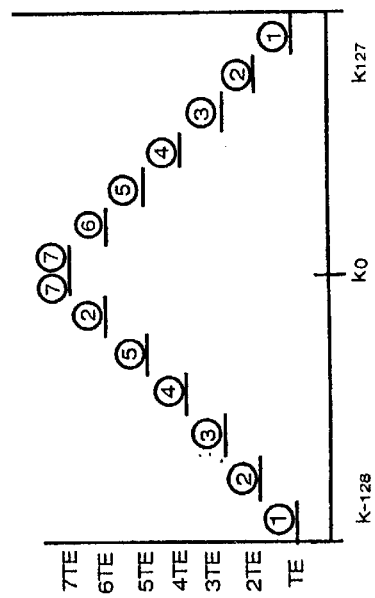
Figure 11:
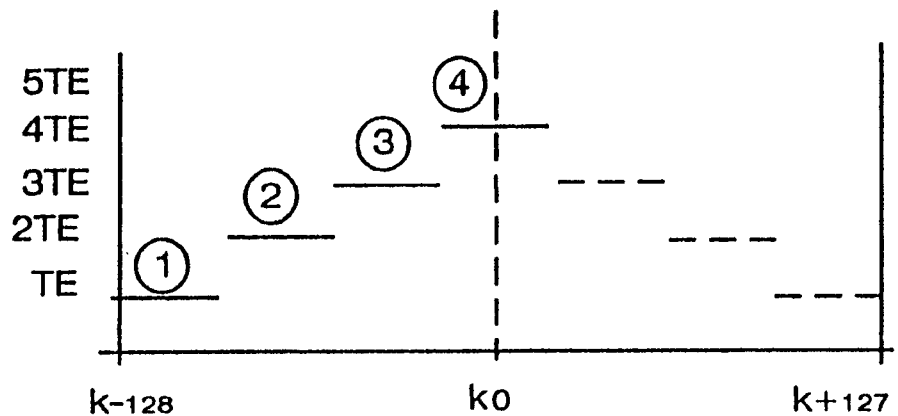
FIGS. 11 and 12 are alternative conventional Fast Spin Echo MRI sequences with Half Fourier Transformation.
Figure 12:
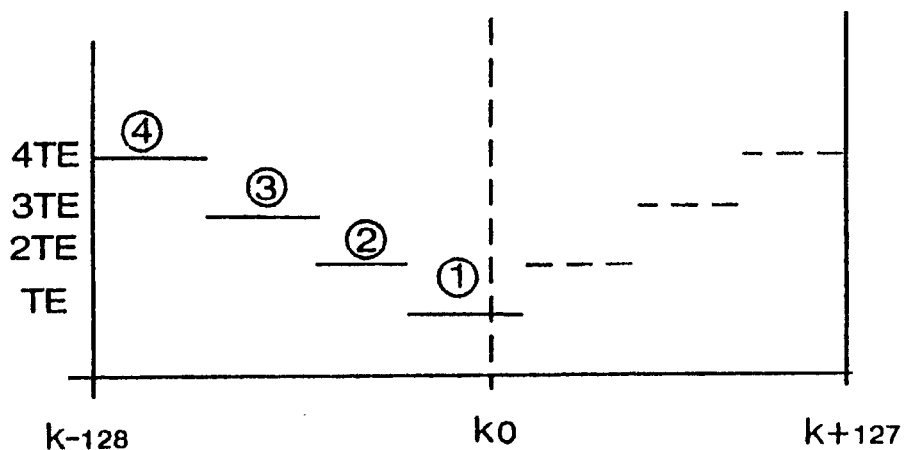

By modifying the sequence of FIG. 6 to include Half Fourier Transform complex conjugation with shared echoes, one can obtain multiple differently-contrasting images from a single scan. Further, the scan can be done in reduced time and with only a single transmission loop. According to one embodiment of the present invention, the phase gradient ($G_y$) signals of FIG. 6 are replaced with the phase gradient signals shown in FIG. 13. Since Half Fourier transforming is used, only the first four spin echoes are required to complete the image in k-space according to the embodiment of FIG. 13. But, since shared echoes are also being used, a fifth echo is added in the FIG. 13 embodiment. This compares with the seven echoes required by the embodiment of FIG. 6. Thus, the present invention realizes an immediate time saving advantage due to the reduced echo read-out requirements in the reduced echo train.

Figure 13:
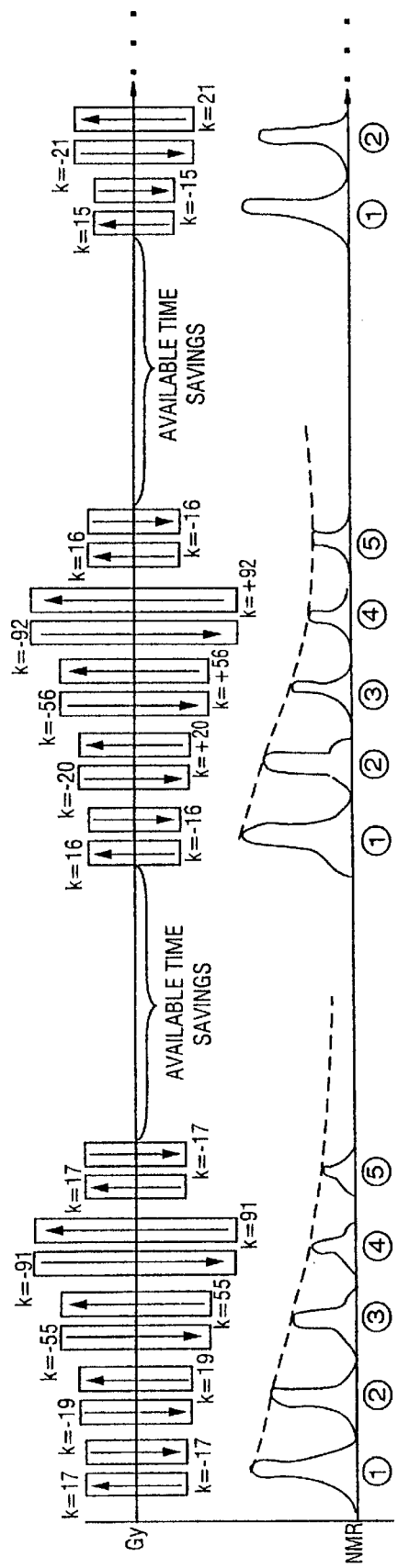
FIG. 13 is a Fast Spin Echo MRI sequence according to the present invention.

Once the above substitutions are made from the embodiment of FIG. 13 into the embodiment of FIG. 6, the sequence of FIG. 6 remains the same. For shorthand purposes only the $G_y$ and NMR signals are shown in FIG. 13, but one of ordinary skill in the MRI art will appreciate that the RF, $G_x$, and $G_z$ signals shown in FIG. 6 are also required for the 2DFT Fast Spin Echo sequence of FIG. 13. In FIG. 13, the phase gradient is in the same k-space position for the signals at the first and fifth echo levels. Also, equal and opposite phase encoding signals are applied after each NMR signal in order to zero sum the previous phase encoding before the next phase encoding sequence. In the example, the phase gradients for the first five echoes following the first 90° pulse correspond to k=+17, -19, -55, -91 and +17, respectively, with equal and opposite gradients to re-phase the nuclei before the next 180° pulse. The next set of echoes (following the second 90° pulse) are decremented to correspond to k=+16, -20, -56, -92 and +16, respectively. Similarly, the third set of echoes (following the third 90° pulse) are again decremented to correspond to k=+15, -21, -57, -93, and +15, respectively. This continues for a plurality of 90° pulses and following sequences until data corresponding to the k-space from k=-126 to k=+17 is acquired.

The present invention is thus characterized by a Fast Spin Echo sequence in which the phase gradient is adjusted for each spin echo following each 90° pulse such that two of the multiple phase gradient pulses correspond to identical k-space locations, but are obtained at different TE periods. This relationship is shown in FIG. 14, which is a representation of the embodiment of FIG. 13.

For purposes of description, we will refer in this description to the set of all echoes immediately following the first 180° pulse sequence (one TE) as the "first level" echoes. The set of phase gradient pulses that phase encode the first level echoes are referred to as the first level phase gradient pulses. Similarly, the set of echoes following the second 180° pulses are the second level echoes. The set of phase gradient pulses that phase encode the second level echoes are referred to as the second level phase gradient pulses. This terminology continues for the third level, fourth level, fifth level, and so on up to the number of echoes used per 90° pulse.

Accordingly, if thirty-six 90° pulses are used per frame and five echoes are taken per 90° pulse, then the first level phase gradient pulses will include thirty-six different signals (occurring at 1TE) corresponding to thirty-six different locations in phase-direction k-space. The set of second level phase gradient pulses will also include thirty-six different signals (occurring at 2TE) corresponding to thirty-six still further different locations in phase-direction k-space, and so on.

Figure 14:
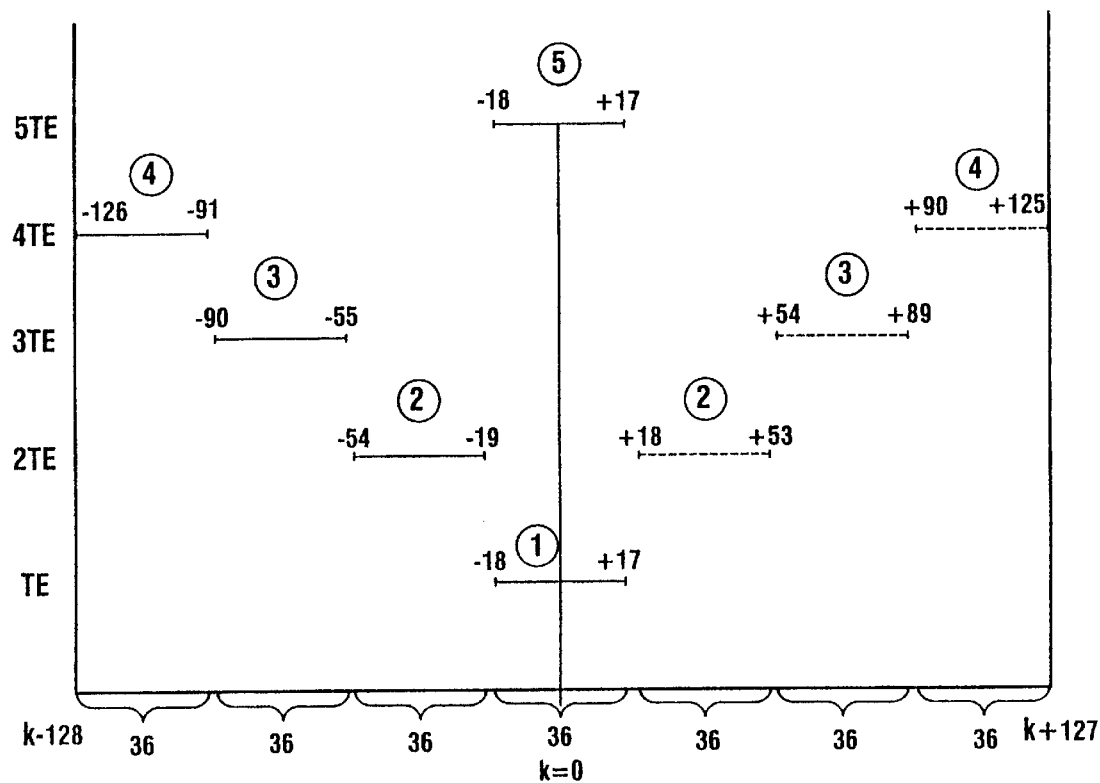
FIG. 14 is a graphical representation of the sequence of FIG. 13.

In FIG. 14, for example, the phase-encoding k-space is filled from k=+17 through k=-126 by the first through fifth level phase gradient pulses. FIG. 14 illustrates the k-space distribution of the phase encoding gradient pulses ($G_y$) used in FIG. 13. For example, after the first 180° pulse (following the first 90° pulse), the first $G_y$ pulse corresponds in amplitude to k=+17 and occurs at the first TE period. This has been translated into FIG. 14 as the first data point on the right-most side of the horizontal line marked with the circled "1", corresponding to the set of first level phase gradient pulses. After rephasing and after the second 180° pulse (following the first 90° pulse), the second $G_y$ pulse corresponds in amplitude to k=-19 and occurs at the second TE period. This has been translated into FIG. 14 as the first data point on the right-most side of the horizontal line marked with the circled "2", corresponding to the set of second level phase gradient pulses. Since five echoes (and five phase gradient encoding signals) are used per 90° pulse in the example of FIG. 13, FIG. 14 shows five levels of phase gradient encoding signals in k-space.

After the five echo signals are obtained for the first 90° pulse, the nuclei are permitted to relax for a predetermined time. Then, the second 90° pulse is imposed (see FIG. 13) and five more echoes (with five more phase gradient encoding signals) are taken. The five echoes following the second 90° pulse fill in the penultimate right-most position on the horizontal lines of FIG. 14 identifying the respective first through fifth level phase gradient pulses.

The first level phase gradient pulses (taken at time TE) will fill k-space from k=+17 through k=-18. The second (taken at time 2TE) will fill k=-19 through k=-54. The third (taken at time 3TE) will fill k=-55 through k=-90. The fourth (taken at time 4TE) will fill k=-91 through k=-126. Finally, the fifth (taken at time 5TE) will fill the same k-space as the first level phase gradient pulses. K-space from k=+18 through k=+125 can then be filled by complex conjugation. As discussed earlier, k-space from k=−127 through k=−128 and from k=+126 through k=+127 filled by another scan or by zero fill data.

Of course, the k-space locations need not be filled in any particular order (incrementing or decrementing by one, for example, between 90° pulses), but can instead be filled in any order or even randomly, provided the full set of scans and full set of phase gradient pulses will fill the k-space.

A feature of the present invention that is illustrated in FIG. 14 is the overlapping phase gradients by at least two of the levels. In FIG. 14 phase gradient pulse levels one and five overlap the k-space from k=−18 through k=+17. This means that the phase gradient pulses that will encode the NMR signals having the highest signal strength occupy the same k-space range as do the phase gradient pulses which encode NMR signals having the weakest signal strength (i.e., the fifth level pulses). This occurs because the fifth level phase gradient pulses are encoding signals that occur later in time (5TE versus 1TE) following the 90° pulse and thus contribute less to relative signal than do the signals encoded by the first level phase gradient pulses. In other words, the 5th echo brings more $T_2$ contrast than first echo.

In the present invention, the non-overlapping phase gradient levels are referred to as "shared echoes." The main advantage here with echo sharing is the effective reduction of echo train length. That is by sharing echoes, the full k-space can be filled with data from, for example, five echoes rather than seven. These shared echoes are used to great advantage since they (together with the different overlapping phase gradient levels) can form the basis for two differently contrasted images obtained from the same data set. Furthermore, with the use of Half Fourier transform complex conjugation, the two differently contrasting images can be obtained in less time than a full data acquisition sequence and with only a single transmission coil. The time savings can be used, if desired, to increase the number of slices acquired in the same time duration.

Figure 15:
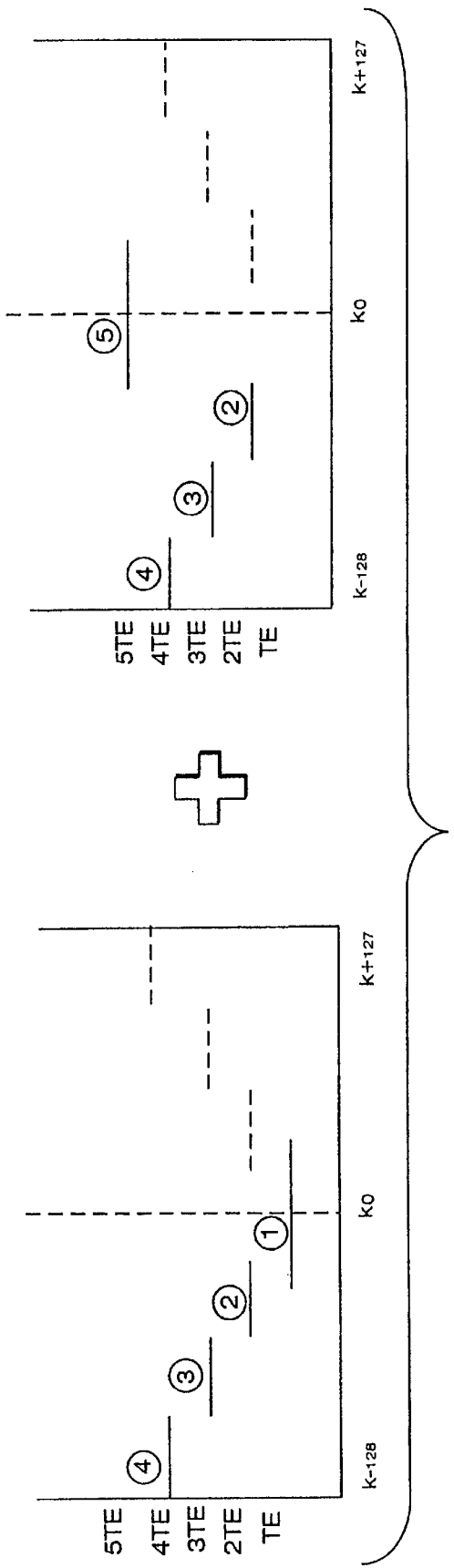
FIG. 15 is a graphical representation of two image sequences obtained from the sequence of FIG. 13.

FIG. 15 illustrates the two images that can be obtained from the data set of FIG. 14. In FIG. 15, a first image is obtained by centering the level one echo response on the zero k-space location and then filling in the positive k-space (from k=+18 through +127) using the complex conjugates of the NMR data obtained from the second, third and fourth level phase encoding. In FIG. 15, the complex conjugate data is shown in dashed lines and corresponds to the complex conjugate of the acquired data at levels two through four (shown in full lines). This first image sequence behaves like a low pass filter since the first level phase gradient pulses (i.e., those contributing to the highest NMR signal strengths) are located near the center of k-space. This then provides an image of a particular contrast corresponding to the low pass behavior of the sequence.

Also shown in FIG. 15 is a second image. In the second image, the level five echo response is centered on the zero k-space location and the image then shares the echoes from levels two through four. Complex conjugation again occurs to fill in data from k=+18 through k=+127 based on the acquired data at levels two through four. The resultant second image is of the same image plane as the first image of FIG. 15, but exhibits a different contrast. That is, the second image of FIG. 15 will not exhibit a true low pass filter behavior since the phase encoding contributing to the lowest signal strengths are centered in the k-space.

The two images of FIG. 15 have a variety of uses. They can be used by a trained technician to clarify aspects of the image plane in different contrasts. They can also be combined by computer processing to form a single image of improved contrast.

The present invention requires shared echoes and complex conjugate data acquisition, but is not limited to any particular number of echoes, any particular k-space resolution, any particular ordering of the signals in k-space, any particular number of images obtained from the acquired data, nor any particular sequence of obtaining the acquired data. The two overlapping echoes also need not occupy the zero k-space location (although that is the preferred arrangement), but can overlap in any k-space location. The number of shared echoes is also not limited, provided at least two non-shared echoes occupy the same k-space at different TE periods and one of the remaining echoes is shared between the images. Thus, the multiple images can be formed from five acquired echo sets with only a single shared echo, two shared echoes, or three shared echoes. When six echo sets are acquired, one to four echoes can be used to create multiple images. As one can see, with a given number "n" of spin echoes recorded following each 90° pulse, one can use from one to n−2 shared echoes in developing multiple images using the present invention.

Figure 16:
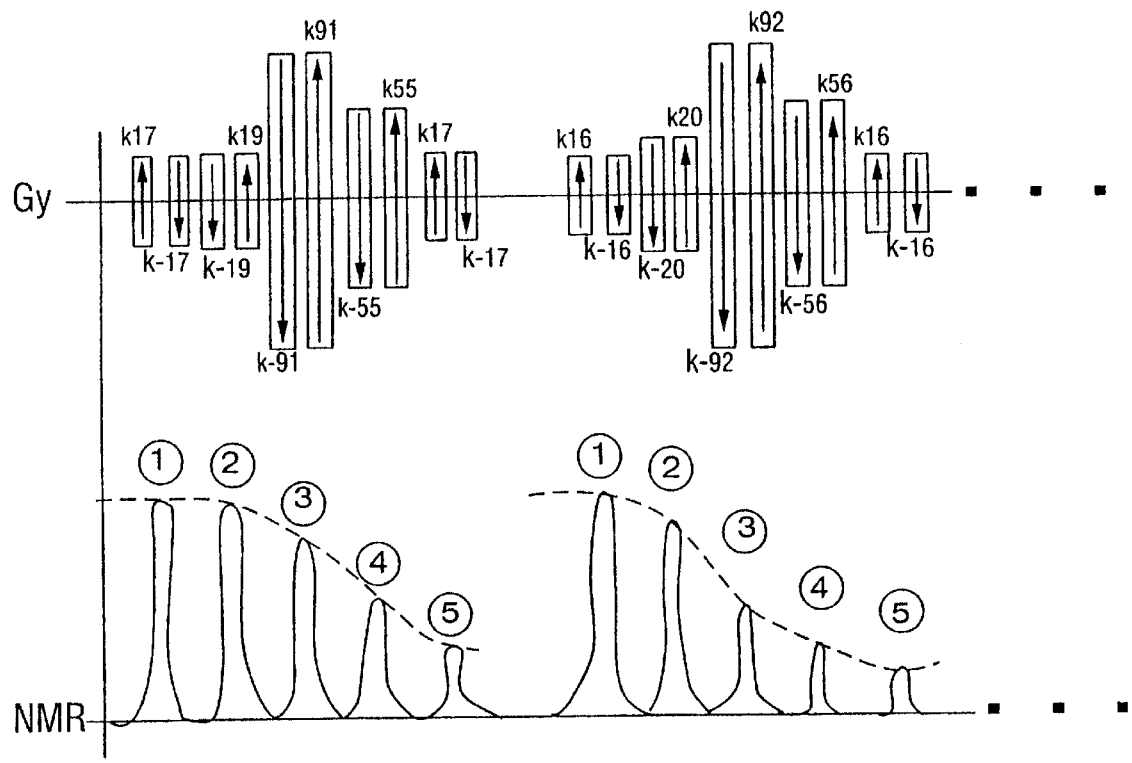
FIG. 16 is an alternative Fast Spin Echo MRI sequence according to the present invention.
Figure 17:
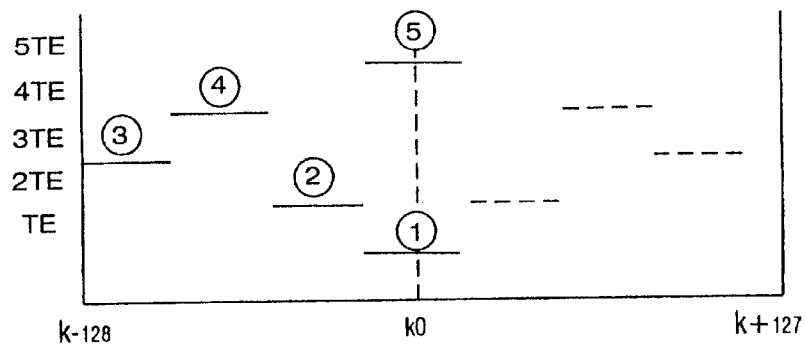
FIG. 17 is a graphical representation of the sequence of FIG. 16.
Figure 18:
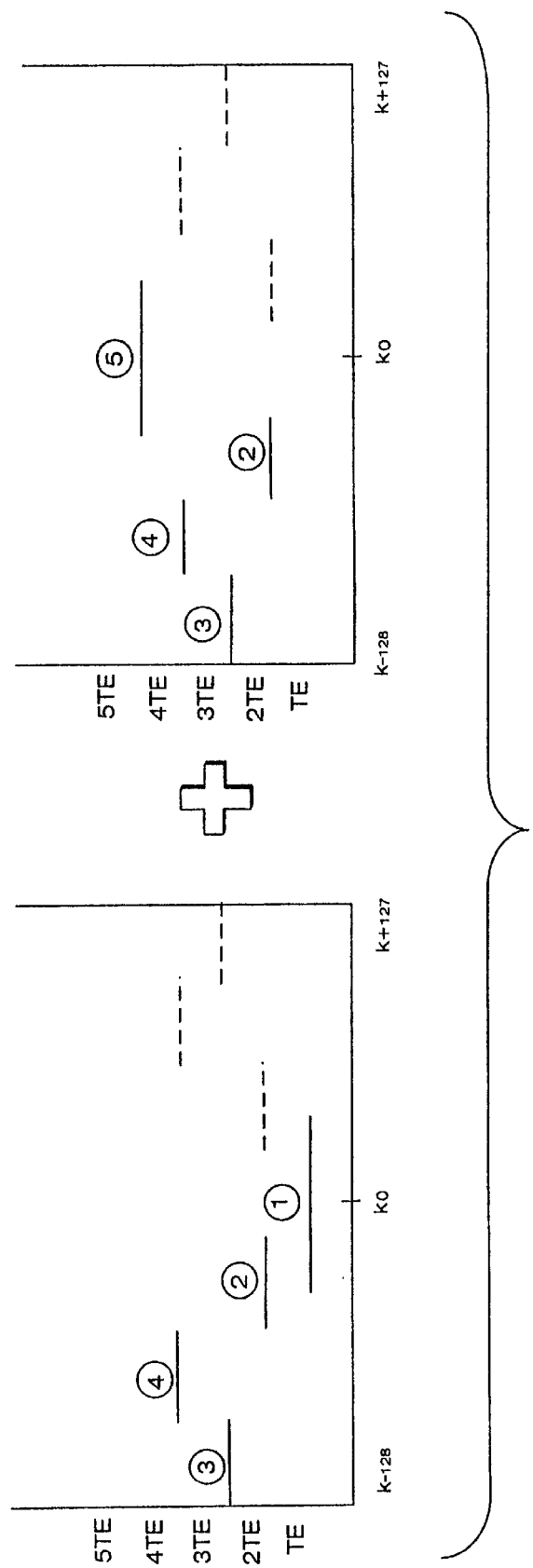
FIG. 18 is a graphical representation of two image sequences obtained from the sequence of FIG. 16.

An example alternative data acquisition sequence is shown in FIGS. 16–18. In this example, FIG. 16 illustrates the timing sequence, FIG. 17 shows the phase encoding gradient k-space distribution, and FIG. 18 shows the two images obtained by complex conjugation and shared echo imaging.

In FIG. 16, a portion of the full Fast Echo Sequence is shown. As one of ordinary skill in this art will understand, the sequence shown in FIG. 16 will also be accompanied by RF, read gradient, and slice gradient signals similar to those shown in FIG. 6. The phase gradient signal is similar to the embodiment of FIGS. 13–15 in that the first level and fifth level phase gradient pulses lie in the same portion of k-space. The embodiment of FIGS. 16–18 differ from that of FIGS. 13–15 in that the phase gradients for the third and fourth levels are transposed in k-space. That is, in the embodiment of FIGS. 16–18, the third level phase gradient occupies the k=−91 through k=−126 position (versus the k=−55 through k=−90 position in FIGS. 13–15) and the fourth level phase gradient occupies the k=−55 through k=−90 position (versus the k=−91 through k=−126 position in FIGS. 13–15).

This transposition of the third and fourth level phase gradients in k-space is shown in FIG. 17 and results in less discontinuity in signal strength between neighboring encoding regions, as shown by the images of FIG. 18, once Half Fourier Transform complex conjugation has filled in the k-space. This discontinuity in signal strength may have two sources: 1) $T_2$ decay, and 2) eddy current response. In FIG. 18, the first image is obtained by centering the first level phase encoding gradients in k-space, then filling the negative k-space with acquired level two through four data, and finally filling the positive k-space with the complex conjugates of the acquired level two through four data. In the second image of FIG. 18, the shared level two through four echoes again fill the negative and positive k-space, but this time centered around the fifth level echo set.

Given the above teachings, many other example sequences will now be apparent to those of ordinary skill in the MRI art in order to accomplish the present combination of shared echo and complex conjugation techniques.

Figure 19:
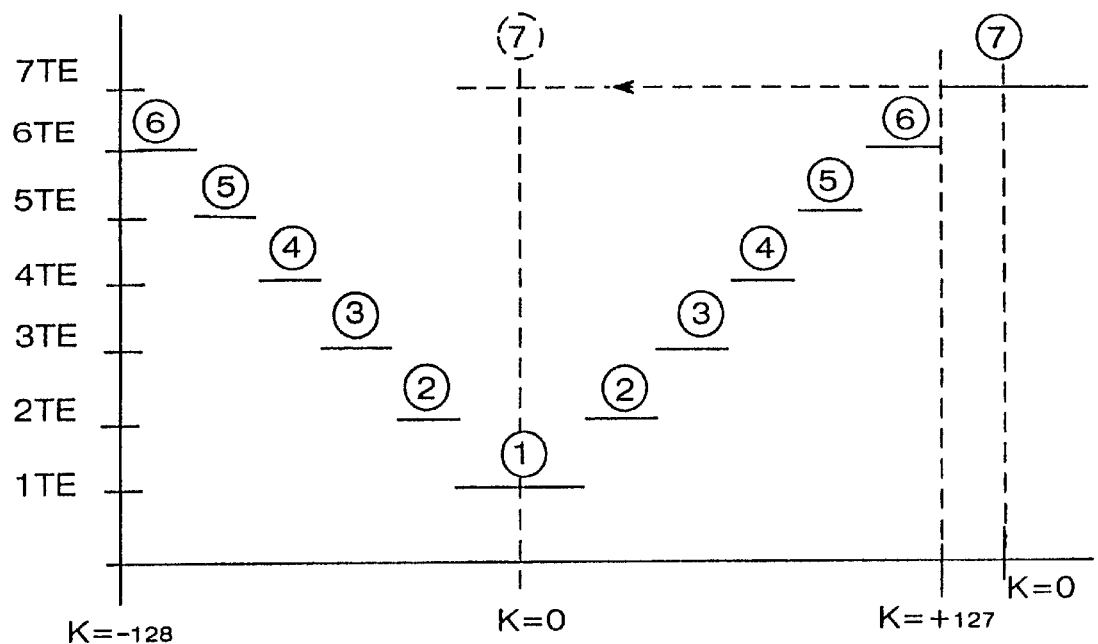
FIGS. 19 and 20 are two additional alternative Fast Spin Echo MRI sequences according to the present invention.

In some embodiments, Half Fourier Transform complex conjugation is not required. In FIG. 19, for example, two images are obtained by shared echo techniques on data acquired across the full k-space phase encoding. The data is acquired by full Fast Spin Echo using seven echoes following each 90° pulse. The first level echo set is phase encoded at the center of k-space, as shown in FIG. 19. The subsequent five echo sets (through level six) are phase encoded at corresponding locations in positive and negative k-space in order to create the low pass filter behavior shown in FIG. 19. Then, the seventh echo set (having the lowest signal strength) is phase encoded at the center of k-space. This seventh echo set thus overlaps the first echo set in k-space but follows it in time.

Then, a first image is produced with full k-space phase encoding, using echo levels one through six. Next, a second image is produced with full k-space encoding, using echo levels two through seven. In the second image, the seventh echo set is translated into the center of k-space and the first echo set is omitted from the image processing. This results in two images of the same image plane, but with different contrast.

The embodiment of FIG. 19 is not preferred since it does not take advantage of the time savings that can be realized by complex conjugation, and as a result increases in the number of slices required. Nevertheless, this embodiment will provide the advantage of multiple images of the same image plane with different contrast.

Figure 20:
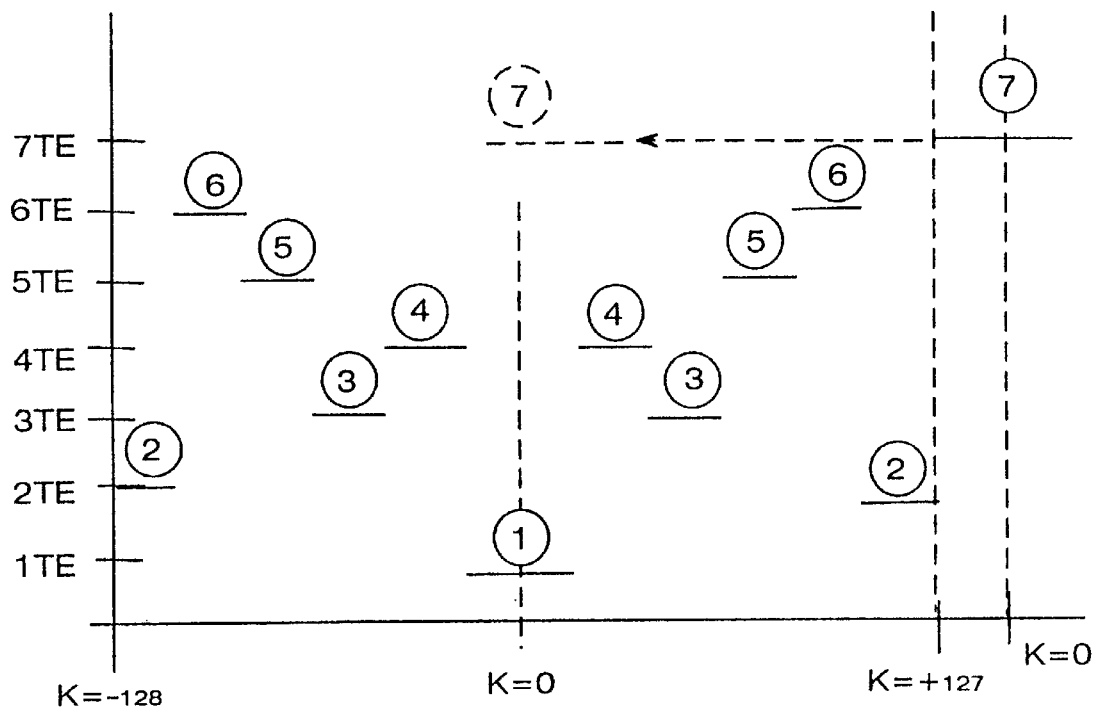

The embodiment of FIG. 20 is similar to that of FIG. 19, except that the sequence of phase encoding over time is altered to more evenly balance the signal discontinuity between neighboring encoding regions.

Another aspect of some example embodiments of the present invention involves the correction of certain phase errors that can occur when two echoes share the same k-space, as do the presently described embodiments of the invention. This aspect is described below with reference to FIGS. 21 and 22.

Figure 21:
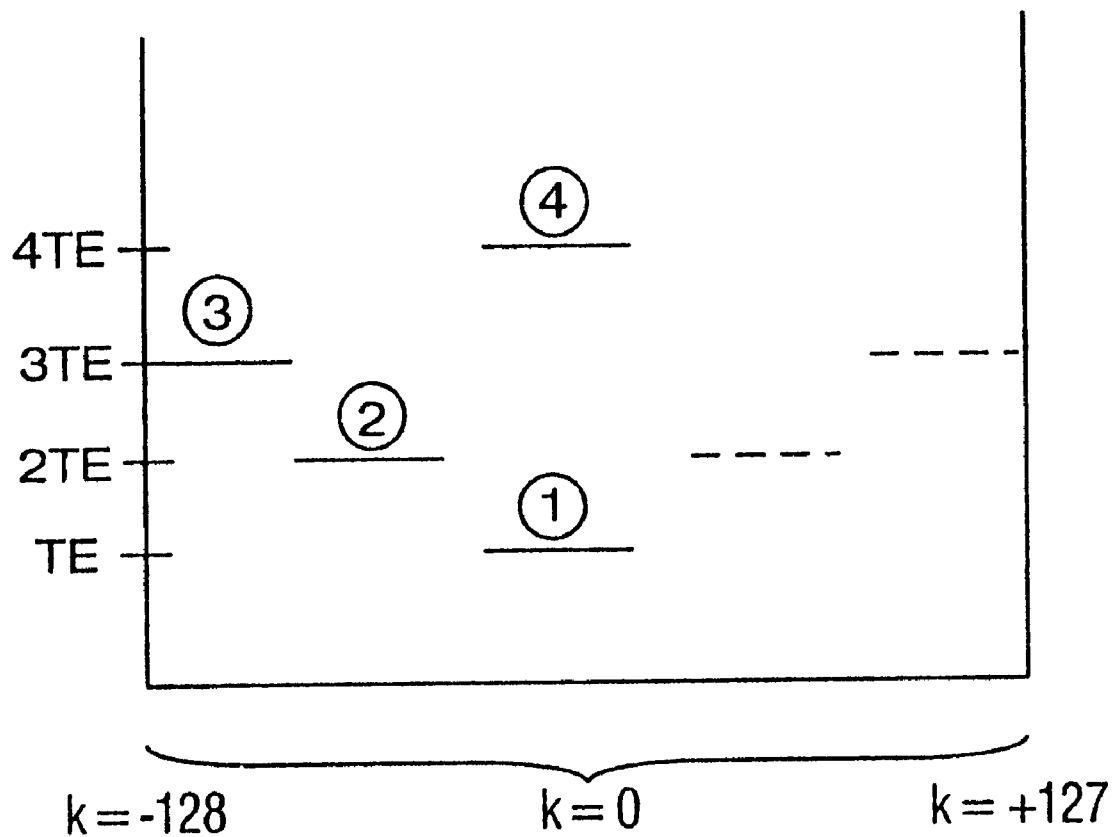
FIGS. 21 and 22 illustrate a phase error correction method used by an alternative example embodiment of the present invention.

In FIG. 21, the echo train includes four NMR signals per 90° pulse. The four 180° pulses per 90° pulse are thus sandwiched by four corresponding pairs of equal and opposite phase encoding signals in k-space. In FIG. 21, the k-space is shown with echoes two and three being shared and echoes one and four overlapping at the center of k-space, in order to achieve the two different image data sets 20 and 21 at the top of FIG. 22. That is, the first image data set 20 is obtained by echo levels one, two and three with complex conjugation of signals two and three appearing to fill the negative k-space. The second image complex data set 21 is obtained from the same data sequence, where echo level four now occupies the center of k-space and echo levels two and three are shared in the positive and negative k-space, by complex conjugation.

Unfortunately, a problem occurs when echo levels one and four occupy the same k-space, in that the second image (from levels two, three, and four) suffers from artifacts caused by the difference in phase between the signal from echo level one and that of echo level four. That is, two signals occupying the same region in k-space may have different phases, resulting in artifacts in the final image.

Figure 22:
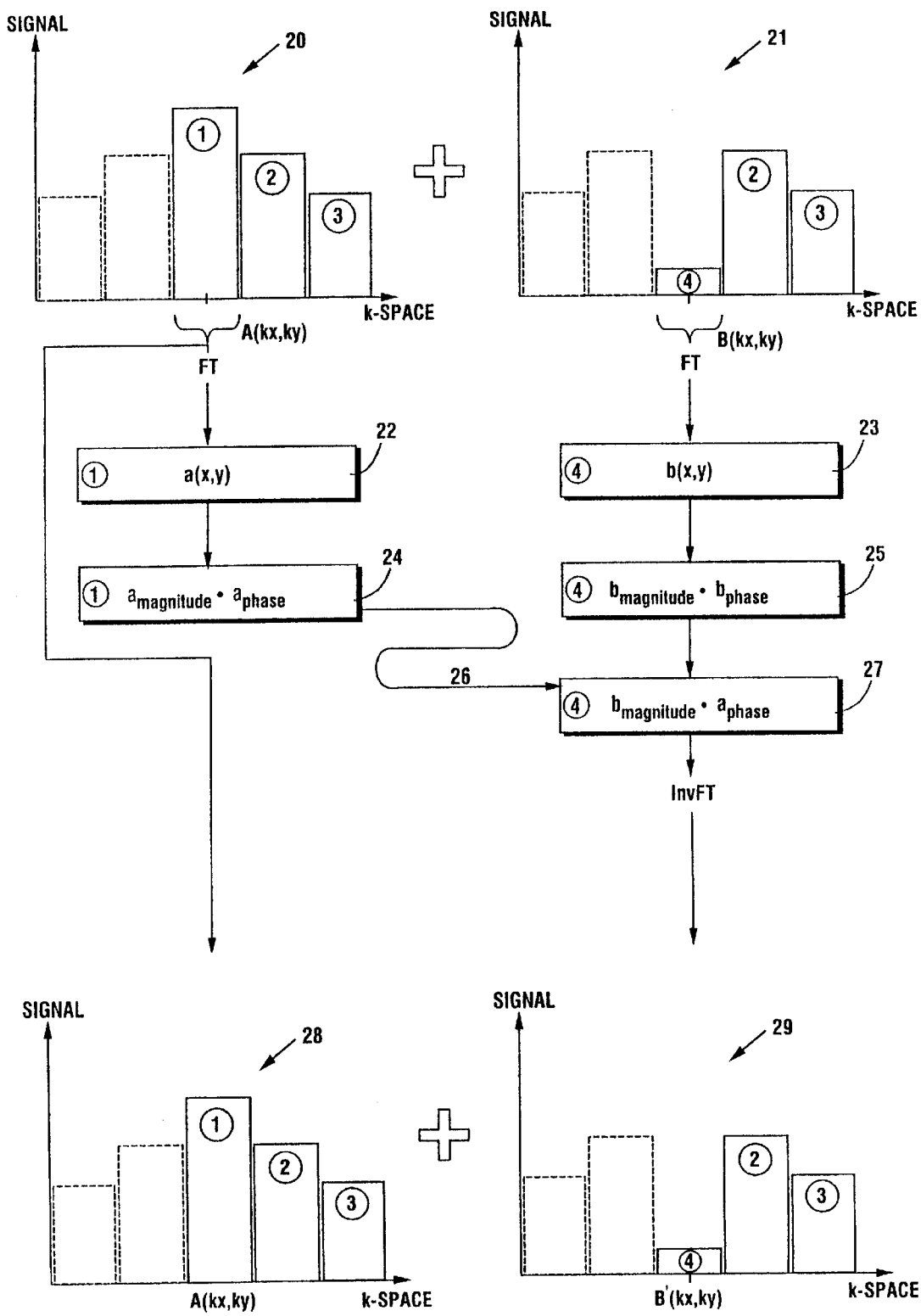

These phase error artifacts can be ameliorated by the steps shown in FIG. 22. First, the data from signal level one (A(Kx,Ky)) is Fourier transformed into a(x,y), at step 22. The same thing is done with signal level four, by Fourier transforming the time domain signal B(Kx,Ky) into the Fourier transform process domain signal b(x,y), at step 23. Signal levels one and four have respective magnitudes and phases of $a_{magnitude} \cdot a_{phase}$ and $b_{magnitude} \cdot b_{phase}$, respectively.

One can then retain the magnitude of signal level four, thus obtaining the signal contrast desired by the shared echo imaging process, but substitute the phase of signal level one into the phase of signal level four, as shown in step 26. The result is a level four signal of $b_{magnitude} \cdot a_{phase}$ at step 27. The phase of the signal level in the center of k-space for both image data 20 and image data 21 thus becomes the same ($a_{phase}$) as signal level one. The process domain signal for level four, $b_{magnitude} \cdot a_{phase}$, is then brought back into the time domain (k-space) by inverse Fourier transformation. This step is taken because shared signal levels two and three are still in the time domain, therefore, signal level four must also be returned to the time domain in order to merge it with signal levels two and three to obtain the full k-space of data. (B'(Kx,Ky))

The result is two image data sets, 28 (identical to data set 20) and 29 (identical to data set 21, except for phase correction at the level four signal). The second image made up of signals levels two, three and four (phase modified) (numeral 29) does not suffer artifacts caused by phase incoherence of signal level four, because the phase of signal level four has been replaced by the phase of signal level one. Nevertheless, the contrast desired by the difference in magnitude in signal level four from the magnitude of signal level one is retained, thereby providing data for two different contrasting images.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A Fast Spin Echo MRI sequence for an MRI system comprising excitation circuitry configured to elicit magnetic responses from an object to be imaged and detection circuitry configured to detect and process the magnetic responses into digital signals representing an image of at least a portion of said object, wherein said MRI system is controlled based on the Fast Spin Echo MRI sequence and the Fast Spin Echo MRI sequence comprises a combination of Half Fourier Transform complex conjugation and shared echo imaging.

2. A Fast Spin Echo MRI sequence according to claim 1, further including phase correction for the shared echo imaging.

3. A Fast Spin Echo MRI system, comprising:
   magnetic coils to elicit MRI data from a body to be imaged;
   a magnetic coil controller to switch the operation of the magnetic coils in accordance with a shared echo imaging sequence;
   an image constructor to receive the MRI data from the magnetic coils and to create an MRI image from the MRI data using Half Fourier Transform complex conjugation; and
   a display to receive and display the MRI image from the image constructor.

4. A Fast Spin Echo MRI system according to claim 3, wherein the controller switches the operation of the magnetic coils to:
   a) nutate selected nuclei to a first angle,
   b) nutate the selected nuclei to a second angle,
   c) spatially phase encode the nutated nuclei at a first value, d) obtain a spin echo NMR signal, e) cancel the phase encoding of c), f) repeat b) through e) a predetermined number of echo times for different phase encoding values, except that said phase encoding values for at least two of said predetermined number of echo times are substantially identical, and g) repeat a) through f) a predetermined number of scan times sufficient to complete the MRI image using said Half Fourier Transform complex conjugation.

5. A Fast Spin Echo MRI system, according to claim 3, wherein the image constructor further creates a second MRI image from the MRI data using the Half Fourier Transform complex conjugation in combination with the shared echo imaging.

6. A Fast Spin Echo MRI system, according to claim 5, wherein both MRI images created by the image constructor are substantially the same except for their relative contrast.

7. A Fast Spin Echo MRI system, according to claim 5, wherein the shared echo imaging sequence results in at least one set of shared echo signals and at least two sets of overlapping echo signals, one of the two MRI images being created by the image constructor from:

1) at least the one set of shared echo signals together with at least one set of overlapping echo signals, and the other of the two MRI images being created by the image constructor from:

2) at least the one set of shared echo signals together with at least the other set of overlapping echo signals.

8. A Fast Spin Echo MRI system, according to claim 7, further including a phase corrector to coordinate the phases between the overlapping sets of echo signals.

9. A Fast Spin Echo MRI system, according to claim 8, wherein the phase corrector:

a) obtains the Fourier transform of said one set of overlapping echo signals to obtain first magnitude and phase components thereof;

b) obtains the Fourier transform of said other set of overlapping echo signals to obtain second magnitude and phase components thereof;

c) substitutes the first phase components with the second phase components; and d) inverse Fourier transforms the second magnitude and first phase components into a phase modified other set of overlapping echo signals; and wherein:

the image constructor creates the second image from at least the one set of shared echo signals together with at least the phase modified other set of overlapping echo signals.

10. A Fast Spin Echo imaging sequence for imaging nuclei, comprising:

(1) generating a static magnetic field;

(2) generating a slice-selective gradient magnetic field to spatially select a slice of a body to be imaged;

(3) transmitting a RF nutating pulse at a first flip angle;

(4) generating a phase-encoded gradient magnetic field to spatially encode nuclei at a particular amplitude;

(5) transmitting a second RF nutating pulse at a second flip angle to cause a spin echo response;

(6) generating a frequency-encoded gradient magnetic field to spatially encode nuclei in another direction of the slice;

(7) during step (6), receiving an NMR signal from the spin echo response of at least some of the spatially phase encoded nuclei of step (4);

(8) at predetermined time intervals, repeating steps (4) through (7) a predetermined number of times for a plurality of phase-encoded gradient magnetic fields, said steps (4) through (8) providing:

(a) at least two sets of spin echo responses corresponding to nuclei spatially encoded at different times in step (4) by phase-encoded gradient magnetic fields having the same particular amplitude, and (b) at least one spin echo response corresponding to nuclei spatially encoded at a time different from any of the times in step (8)(a) and at an amplitude different from the same particular amplitude of step (8)(a);

(9) extrapolating the Half Fourier complex conjugate of the spin echo response of step (8)(b);

(10) selecting one of said two spin echo responses from step (8)(a);

(11) combining the spin echo responses obtained in steps (8)(b), (9), and (10);

(12) preparing an image from the spin echo responses combined in step (11); and

(13) repeating steps (10) through (12) by selecting the other one of said two spin echo responses in step (10).

11. A Fast Spin Echo imaging sequence, according to claim 10, wherein the two images obtained in steps (11) through (13) are the same except for their relative contrast.

12. A Fast Spin Echo imaging sequence, according to claim 10, wherein at least the one set of spin echo responses correspond to nuclei spatially encoded in the approximate center of an image k-space.

13. A Fast Spin Echo imaging sequence, according to claim 10, further including the step of correcting the phases between at least the two sets of spin echo responses obtained in step (8)(a).

14. A Fast Spin Echo imaging sequence, according to claim 10, wherein at least the two sets of spin echo responses of step (8)(a) are characterized by a first set of spin echo responses $A(Kx,Ky)$ and a second set of spin echo responses $B(Kx,Ky)$, the imaging sequence further including the steps of:

12a) obtaining the Fourier transform of the first set of spin echo responses $A(Kx,Ky)$ to obtain magnitude and phase components $a_{magnitude} \cdot a_{phase}$;

12b) obtaining the Fourier transform of the second set of spin echo responses $B(Kx,Ky)$ to obtain magnitude and phase components $b_{magnitude} \cdot b_{phase}$;

12c) substituting the $a_{phase}$ component with the $b_{phase}$ component in the signal from step 12b) to obtain $b_{magnitude} \cdot a_{phase}$; and 12d) inverse Fourier transforming the $b_{magnitude} \cdot a_{phase}$ into a phase modified second set of spin echo responses $B'(Kx,Ky)$, said other one of said two spin echo responses used in step (13) being $B'(Kx,Ky)$.

15. A method for generating MRI signals from nuclei within an image volume, comprising:

(a) nutating the nuclei;

(b) applying a sequence of 180° pulses to the nutated nuclei to produce spin echoes;

(c) phase encoding the spin echoes using phase gradient pulses, wherein two of the phase gradient pulses correspond to the same location in k-space;

(d) repeating (a) through (c) to obtain at least one set of shared echo signals, and at least first and second non-shared sets of echo signals each of which corresponds to the same locations in k-space;

(e) generating a first image of one contrast based on a complex conjugation of the at least one set of shared echo signals and on the first non-shared set of echo signals; and (f) generating a second image of another, different contrast based on the complex conjugation of the at least one set of shared echo signals and on the second non-shared set of echo signals.

16. A method according to claim 15, further comprising:
  phase-correcting the first and second non-shared sets of echo signals.

17. Control and image processing circuitry for a fast spin echo imaging system, the control and imaging processing circuitry being programmed to perform the method of claim 15.

* * * * *